United States Patent [19]

Gehrt et al.

[11] Patent Number: 4,874,966
[45] Date of Patent: Oct. 17, 1989

[54] MULTIVIBRATOR CIRCUIT HAVING COMPENSATED DELAY TIME

[75] Inventors: Heinz H. Gehrt; Günter Hildebrandt, both of Hamburg; Karl-Heinz Rehfeldt, Ellerbek, all of Fed. Rep. of Germany

[73] Assignee: U.S. Philips Corporation, New York, N.Y.

[21] Appl. No.: 146,889

[22] Filed: Jan. 22, 1988

[30] Foreign Application Priority Data

Jan. 31, 1987 [DE] Fed. Rep. of Germany ....... 3702854
Feb. 27, 1987 [DE] Fed. Rep. of Germany ....... 3706319

[51] Int. Cl.$^4$ .......................... H03K 3/281; H03K 5/13
[52] U.S. Cl. .................... 307/291; 307/247.1; 307/356; 307/296.6; 307/608; 331/113 R
[58] Field of Search ...................... 307/291, 247.1, 603, 307/605, 608, 593, 290, 291, 355, 299.2, 356, 296.6; 331/113 R

[56] References Cited

U.S. PATENT DOCUMENTS

| | | | |
|---|---|---|---|
| 3,912,950 | 10/1975 | Tada | 307/291 |
| 3,996,478 | 12/1976 | Kasperkovitz | 307/291 |
| 4,088,903 | 5/1978 | Jones | 307/291 |
| 4,357,546 | 11/1982 | Govaert | 307/291 |
| 4,641,048 | 2/1987 | Pollock | 307/608 |
| 4,668,881 | 5/1987 | Piasecki | 307/291 |

FOREIGN PATENT DOCUMENTS

| | | | |
|---|---|---|---|
| 0121450 | 10/1978 | Japan | 307/291 |
| 0128656 | 10/1979 | Japan | 307/291 |
| 0021608 | 2/1980 | Japan | 307/291 |
| 0151814 | 11/1980 | Japan | 307/291 |
| 0070804 | 4/1985 | Japan | 307/291 |
| 2120888 | 12/1983 | United Kingdom | 307/291 |

*Primary Examiner*—John S. Heyman
*Assistant Examiner*—Tai V. Duong
*Attorney, Agent, or Firm*—Bernard Franzblau

[57] ABSTRACT

A multivibrator circuit used as a delay element. A pair of complementary signals to be delayed control the transistors of a long tailed pair so as to generate charging and discharging currents for a capacitance coupled between first and second current branches of the multivibrator circuit. The delay time depends, among other parameters, on the exact values of these currents. In order to avoid the necessity of providing very accurate values of the signals for generating the proper current values, a current division is applied, to the circuit by adding in parallel to each long tailed pair transistor, a constant current source. As a result the currents in the multivibrator circuit can be switched between two exactly determined current values by alternately switching the long tailed pair transistors fully on and off. The same kind of current division is applied to the circuit in order to achieve a voltage swing at the output which is independent of the current adjustment.

9 Claims, 2 Drawing Sheets

MULTIVIBRATOR CIRCUIT HAVING COMPENSATED DELAY TIME

BACKGROUND OF THE INVENTION

This invention relates to a multivibrator circuit having a first and a second current branch each of which comprises a series arrangement of a resistance, a main current path of a main transistor and a controllable current source, wherein the first connection nodes between each main current path and its controllable current source are coupled to each other via a capacitance, and a control electrode of the main transistor, having its main current path inserted in the one current branch, is coupled to a second connection node between the resistance and the main current path of the main transistor in the other current branch, whereby the controllable current sources are oppositewise controlled thereby generating alternately in each of the current branches in a first state a first current and in a second state a second current.

Such a multivibrator circuit is known from JP-Kokai 60-70804, where it is used as a delay element in a FM demodulation circuit.

The controllable current sources in the known delay element are constituted by a long tailed transistor pair, the control electrodes thereof receiving mutually complementary signals to be delayed. The currents supplied by the controllable current sources in both the first and second state depend on the exact values of the input voltages, representing the input signals, on the control electrodes of the long tailed transistor pair. The ratio of these currents determines the delay time attributed to the signals.

It is an object of the invention to provide a multivibrator circuit in which the delay time is exactly determined in dependence on the input signals without the need for feeding the controllable current sources with input signals having accurately determined values. A way of adjusting the delay time in the prior art circuit is to adjust the total current drawn by the controllable current sources. Then the problem arises that the voltage swings across the resistances are changed.

These voltages represent output signals to be fed to the next circuits. Changes therein, induced by the adjustment, could be dealt with by buffers inserted between the multivibrator circuit and the next circuits. However, this increases the number of circuits. It is therefore a further object of the invention to provide a multivibrator circuit having a constant voltage swing across the resistances independent of the adjustment of the total current drawn by the controllable current sources.

SUMMARY OF THE INVENTION

Therefore, a multivibrator circuit according to the invention is characterized in that in parallel with each controllable current source a constant current source is connected. The controllable current sources are switched on and off instead of being switched between two non-zero-current states. in the first state a current in a current branch equals the constant current supplied by the constant current source. In the second state a current in a current branch then equals the sum of the constant current and the current supplied by the controllable current source. With this current division the delay element is less susceptible to inaccuracies in the amplitudes of the signals controlling the controllable current source. Therefore, a broad variety of input signals may be supplied to the input side without affecting the output signals.

With the same kind of current division the time delay caused by the multivibrator circuit in accordance with the invention is made adjustable without the need for adapting the circuits, fed by the multivibrator circuit, to the chosen adjustment.

Therefore, a multivibrator circuit according to the invention is characterized in that the controllable current sources together comprise a first current source and two further transistors, having control electrodes constituting control terminals for controlling the controllable current sources, and having their main current paths connected between the first connection nodes and the first current source, whereby there are provided a first and a second additional transistor, respectively, having a first and a second control electrode connected to the control electrode of the main transistor in the first and second current branch, respectively, and a first and second main current path connected to the second connection node in the first and second current branch, respectively, and to a second current source, whereby the sum of the currents of said first and second current sources is a constant.

The two additional transistors connected to the second current source are switched in synchronism with the main transistors. The current through one of the resistances is divided into a first part conducted by the relevant additional transistor towards the second current source and into a second part, conducted by the relevant main transistor towards the capacitance and the relevant further transistor, constituting a component of the controllable current source. Both parts together generate the voltage across the resistance. The second part, charging the capacitance, gives rise to the delay time. By keeping the sum of the currents supplied by the first and second current source constant the voltage swing across the resistances is kept constant, which avoids adapting the next stages to adjustments within the multivibrator circuit.

BRIEF DESCRIPTION OF THE DRAWING

The invention will be discussed below in the light of the accompanying drawing in which.

DESCRIPTION OF THE PREFERRED EMBODIMENTS

Figure 1:
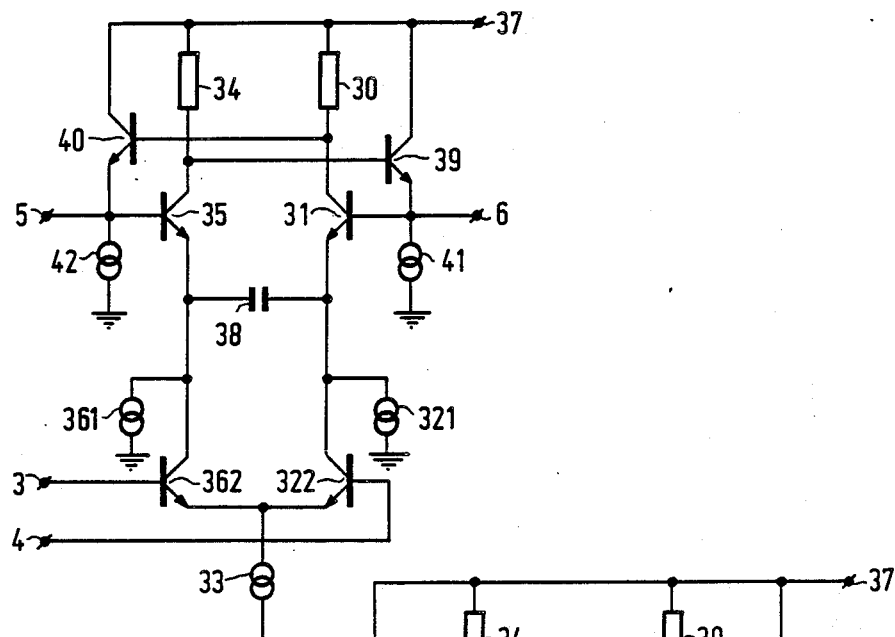
FIG. 1 represents an embodiment of a multivibrator circuit in accordance with the invention.

In FIG. 1 there is shown an embodiment of a multivibrator circuit in accordance with the invention. The circuit comprises a first and a second current branch. The first current branch comprises a series arrangement of a resistance 34, main transistor 35 and controllable current source 362/33 and the second current branch comprises a series arrangement of resistance 30, main transistor 31 and controllable current source 322/33. On the one hand the current branches are coupled to each other via capacitance 38 and on the other hand via respective emitter followers 40/42 and 39/41, inserted between the control electrode of the main transistor in the one current branch and the connection between the resistance and the main transistor in the other current branch. The controllable current sources 326/33 and 322/33 constitute a long tailed pair fed via input terminals 3 and 4 and which receive the input signal to be delayed. The delayed signal is present on output terminals 5 and 6. The delay time depends on the frequency of the input signal which must lie within a predetermined frequency range.

When a constant voltage is applied to input terminals 3 and 4, the output signals on terminals 5 and 6 are opposite oriented oscillations, the amplitude of which depend on the induced currents in the current branches and the frequency of which in addition depends on the value of capacitance 38.

On the other hand, when the transistors 362 and 322 are alternately switched between a first and a second conducting state by applying varying input signals to terminals 3 and 4, the frequency of which lies within said frequency range, the delayed output signal follows the input signal. The delay time is determined by the current in the current branches and the value of capacitance 38.

In the prior art multivibrator circuit the values of the input signals must be accurately determined in order to generate in the current branches currents having the proper values in the first and in the second state, thereby fixing the delay time.

In the multivibrator circuit in accordance with the invention, constant current sources 361 and 321 are connected in parallel to the controllable current sources in order to accomplish a current division. As transistors 362 and 322 may be alternately switched on and off, the currents in the current branches switch between two exactly defined values.

Figure 2:
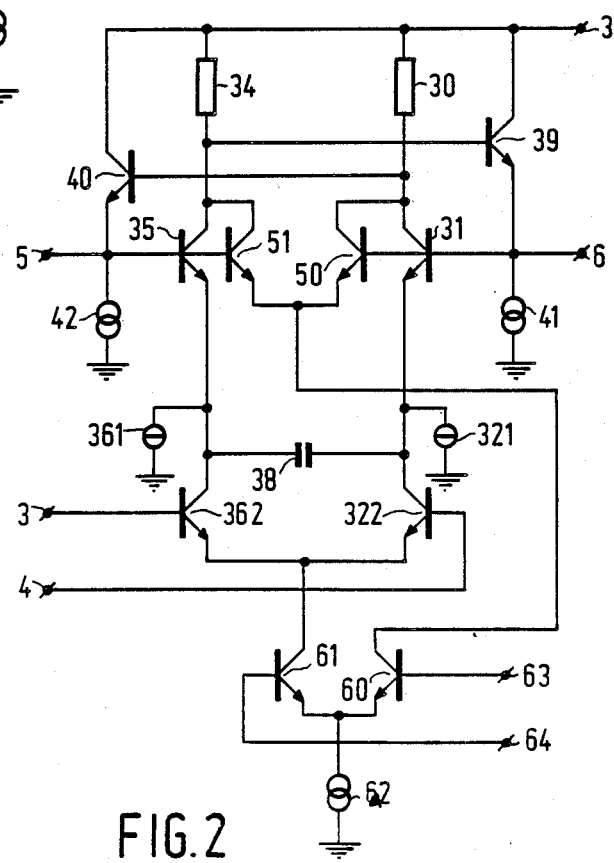
FIG. 2 represents a further embodiment of a multivibrator circuit in accordance with the invention.

In FIG. 2 a further embodiment of a multivibrator circuit in accordance with the invention is shown. Like reference numerals designate identical or corresponding components as are shown in the previous figure. The circuit is extended by additional transistors 50 and 51 which are controlled in synchronism with main transistors 31 and 35. These additional transistors 50 and 51 enlarge the voltage swing across resistances 34 and 30 by drawing an additional current. Since the current through one resistance is divided into a first part drained by the relevant additional transistor, e.g. 50 and into a second part conducted by the relevant main transistor, e.g. 31, the enlargement of the voltage swing does not influence the capacitance charging current and therefore does not affect the delay time determining quantities. The delay time is adjusted by adjusting the second part of the current which is conducted by transistors 362 and 322. However, changing this second part implies, without further measures being taken, a change in the voltage swing across the resistances. Therefore, the sum of the total current, conducted by transistors 362 and 322, and by the additional transistors 50 and 51 must be kept constant. This is accomplished by connecting the long tailed pairs 50/51 and 362/322 to respective connections of a long tailed pair 60/61 which are in turn controlled via terminals 63 and 64 and which conduct a current supplied by a current source 62.

Figure 3:
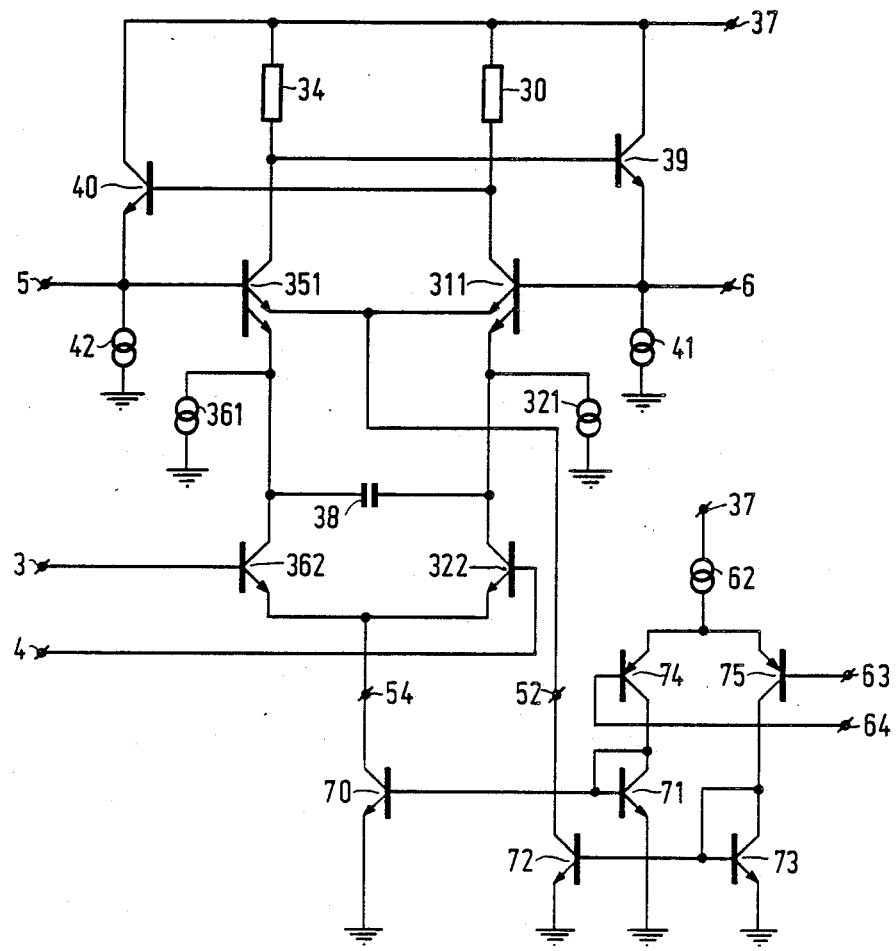
FIG. 3 represents a next further embodiment of a multivibrator circuit in accordance with the invention.

In FIG. 3 a preferred embodiment of a multivibrator circuit in accordance with the invention is represented. Again, like reference numerals designate identical or corresponding components to those shown in the previous Figure.

Now main transistors 31 and 35 and additional transistors 50 and 51 shown in the previous Figures have been replaced by two multiemitter transistors 311 and 351. The long tailed pair in the transistor arrangement 311/351 and the long tailed pair 322/362 respectively, now are connected to current mirrors 72/73 and 70/71 respectively, which are controlled by the long tailed pair of control transistors 74/75, which has a current source 62 connected to supply terminal 37. As compared to the previous Figure, the advantage here consists in that fewer components are placed in series between the supply terminals. This implies that a lower supply voltage is sufficient to drive the circuit.

What is claimed is:

1. A multivibrator comprising:
first and a second current branch, each of which comprises a series arrangement of a resistance, a main current path of a main transistor and a controllable current source, a first connection node between the main transistor main current path and the controllable current source of the first branch being coupled via a capacitance to another first connection node between the main current path of the main transistor and the controllable current source of the second branch, a control electrode of the main transistor in one current branch being coupled to a second connection node between the resistance and the main current path of the main transistor in the other current branch so that the controllable current sources are oppositewise controlled for generating alternately in each of the current branches in a first logical state a first current and in a second logical state a second current, and means connecting a respective constant current source in parallel with each controllable current source.

2. A multivibrator circuit as claimed in claim 1 wherein the controllable current sources together comprise a first current source, said multivibrator circuit further comprising two further transistors having control electrodes for controlling the controllable current source and having their main current paths connected between the first connection nodes and the first current source, a first and a second additional transistor having a first and a second control electrode connected to a respective control electrode of the main transistor in the first and second current branch, respectively, and having a first and second main current path connected to a respective second connection node in the first and second current branch and to a second current source such that the sum of the currents of said first and second current sources is a constant.

3. A multivibrator circuit as claimed in claim 2, wherein the first and second current source together comprise a long tailed pair including a first and a second control transistor, said pair being connected via a third current source to a supply voltage terminal, the first and second current sources being oppositely controlled via a voltage applied to the control electrodes of said first and second control transistor.

4. A multivibrator circuit as claimed in claim 3, wherein the further transistors and the additional transistors are connected to a first and a second current mirror, respectively, said first and second current mirrors each having a current branch coupled to a respective control transistor so that the first and second current mirrors are controlled by the first and second control transistor, respectively, and where the first and second control transistor are of a conductivity type different from that of the further and additional transistors.

5. A multivibrator circuit comprising:
a first current branch comprising a first series circuit including a first resistor, a first main transistor and a first controllable current source,
a second current branch coupled in parallel with the first current branch between first and second terminals of a source of supply voltage and comprising a second series circuit including a second resistor, a second main transistor and a second controllable current source,
a capacitor coupled between a first node formed between the first main transistor and the first controllable current source and another first node formed between the second main transistor and the second controllable current source,
means coupling a control electrode of the first main transistor and of the second main transistor to respective second connection nodes in the second and first current branches, respectively, where each of said second connection nodes is formed between the respective resistor and main transistor in its current branch,
input means for controlling said controllable current sources out of phase so that the multivibrator circuit assumes first and second logic states in which first and second currents are alternately supplied to said first and second current branches, and
first and second constant current sources connected in parallel with said first and second controllable current sources, respectively.

6. A multivibrator circuit as claimed in claim 5 wherein said first and second controllable current sources comprise first and second input transistors connected in series with a third constant current source, and wherein said input means include control electrodes of said input transistors coupled to first and second input terminals that supply complementary input signals to the multivibrator circuit.

7. A multivibrator circuit as claimed in claim 6 further comprising:
third and fourth transistors connected in a first long tailed pair configuration between the second connection nodes of the first and second current branches and said third current source and with their control electrodes connected to respective control electrodes of the first and second main transistors, said third and fourth transistors being controlled so as to maintain the voltage swing across each of said first and second resistors substantially constant.

8. A multivibrator circuit as claimed in claim 7 wherein said first and second input transistors are connected in a second long tailed pair configuration between the first connection nodes of the first and second current branches and via a first control transistor to said third constant current source, said multivibrator circuit further comprising:
a second control transistor connected in a third long tailed pair configuration with the first control transistor and in series between the first long tailed pair transistors and the third constant current source, and
second input means coupled to control electrodes of the first and second control transistors to control conduction in said control transistors.

9. A multivibrator circuit as claimed in claim 6 wherein said input terminals supply switching signals that alternately drive said input transistors full on and full off, whereby currents in said first and second current branches are switched between first and second finite and exactly determined values of current.

* * * * *